(12) United States Patent
Nagadomi et al.

(10) Patent No.: US 7,778,078 B2
(45) Date of Patent: Aug. 17, 2010

(54) MEMORY SYSTEM AND CONTROL METHOD THEREOF

(75) Inventors: Yasushi Nagadomi, Yokohama (JP);
Daisaburo Takashima, Yokohama (JP);
Kosuke Hatsuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 12/019,227

(22) Filed: Jan. 24, 2008

(65) Prior Publication Data

US 2008/0181018 A1 Jul. 31, 2008

(30) Foreign Application Priority Data

Jan. 25, 2007 (JP) .......................... P2007-014863

(51) Int. Cl.
*G11C 16/04* (2006.01)
(52) U.S. Cl. .............................. 365/185.09; 365/185.17
(58) Field of Classification Search ............ 365/185.09, 365/185.17, 185.08
See application file for complete search history.

(56) References Cited

U.S. PATENT DOCUMENTS

| | | | | |
|---|---|---|---|---|
| 5,381,379 A * | 1/1995 | Fukumoto | ................ | 365/238.5 |
| 6,005,810 A * | 12/1999 | Wu | ........................ | 365/185.33 |
| 7,248,493 B2 | 7/2007 | Takashima et al. | | |
| 2005/0210184 A1* | 9/2005 | Chen et al. | ................... | 711/103 |
| 2006/0274566 A1 | 12/2006 | Takashima et al. | | |
| 2009/0273970 A1* | 11/2009 | Fuji | ........................... | 365/163 |

FOREIGN PATENT DOCUMENTS

JP 2004-326867 11/2004

* cited by examiner

*Primary Examiner*—Vu A Le
(74) *Attorney, Agent, or Firm*—Oblon, Spivak, McClelland, Maier & Neustadt, L.L.P.

(57) ABSTRACT

A memory system includes: a flash memory that stores data; a memory that stores a read count table that indicates the number of times of data read from the flash memory; and a controller that performs: reading out the data from the flash memory; updating the read count table when the controller performs reading out the data from the flash memory; and refreshing the flash memory based on the read count table.

20 Claims, 9 Drawing Sheets

FIG. 11

MEMORY SYSTEM AND CONTROL METHOD THEREOF

CROSS-REFERENCE TO RELATED APPLICATIONS

This application is based upon and claims the benefit of priority from Japanese Patent Application No. 2007-014863, filed Jan. 25, 2007, the entire contents of which are incorporated herein by reference.

BACKGROUND OF THE INVENTION

The present invention relates to a memory system using a flash memory having a restriction on the number of reads and a control method thereof.

In recent years, a semiconductor memory is being used throughout from a main storage of a large-scale computer to a personal computer, a home electric appliance, a mobile phone, and the like. In particular, a flash EEPROM type nonvolatile memory (hereinafter, referred to as "flash memory") is attracting a lot of attention. There are advantages in that the flash memory retains data even when power is off and has a structure suitable for high integration. For this reason, the flash memory is being used in many information devices such as a mobile phone, a digital camera, and the like.

The flash memory is mainly a NOR type and a NAND type. In the NOR type, data is readable at a high rate and the number of reads is approximately $10^{13}$. The NOR type is used as an instruction code storage of a portable device. On the other hand, the NOR type has a small effective bandwidth at the time of writing data and is not suitable for a large capacity of file record or the like. Compared with this, the NAND type is advantageous in that a high integration is facilitated and an effective burst bandwidth is high since a so-called burst read (in which data is continuously read for a row of addresses at a high rate) is possible. Moreover, there is an advantage in that data is fetched in a burst mode and a large number of bits are collectively writable in a page unit since the number of bits writable to or erasable from a memory cell at the same time is large. Consequently, an execution bandwidth can increase, such that it is available in a memory card, a USB memory, a memory of a mobile phone, and the like and is recently being considered as a replacement of the hard disk.

On the other hand, there are a restriction on the number of writes/erases and a restriction on the number of reads as one obstacle when the NAND type flash memory is considered as the replacement of the hard disk.

In the write/erase operation of the flash memory, a high voltage is applied to a gate for a substrate and electrons are injected into a floating gate. For this reason, the write/erase operation is executed a number of times and an oxide film around the floating gate is deteriorated, such that data is destroyed. The number of writes for the flash memory is approximately $10^5$, and is smaller than those of other nonvolatile memories. When the flash memory is used as the hard disk, there is a problem in that data may be destroyed due to a restriction on the number of writes/erases and the system may be obstructed. As a countermeasure to this, wear leveling for averaging the number of writes/erases is performed by counting the number of erases on a block basis, setting a threshold value, and converting physical addresses of a block of the small number of erases and a block of the large number of erases.

In the read of the NAND type flash memory, 0 V is applied to a gate of a selection cell for each bit line, a high voltage (V Read) is applied to a gate of a non-selection cell and a selection gate, and "1" or "0" is determined according to whether the selection cell is conductive. Consequently, when the read is repeated, the high voltage is repeatedly applied to non-selection cells (corresponding to all memory cells of all pages except a read target as viewed from a block unit), electrons enters the floating gate while passing through the oxide film, and a threshold value of the memory cell is varied, thereby leading to data destruction (so-called read disturb). Moreover, the use time (or the number of accesses) increases, such that the oxide film is further deteriorated due to the write/erase operation and a frequency of occurrence of the read disturb becomes high. A limit of the number of reads of the NAND type flash memory is approximately $10^4$. To prevent this read disturb, a block of the large number of reads should be appropriately rewritten and the threshold value should return (or be refreshed) to the original state (for example, see JP-A-2004-326867).

However, in a conventional memory system and a conventional control method thereof, a counter of the number of reads is provided in a page unit. When the number of reads reaches a reference value, data passes through an error correction circuit (ECC). When the number of reads exceeds the reference number, a target block is rewritten and refreshed. For this reason, various problems may occur according to degrees of error correction capability of the ECC. That is, when the correction capability is low, an error of several bits may be only detected in a unit of one page at the most. There is a problem in that a countermeasure may not be taken when read disturb occurs in several tens~several hundreds bits at one time. When the error correction capability is high, there is a problem in that a ratio of redundant bits to data is large and a ratio at which ECC bits occupy a memory capacity is large or there is a problem in that a data transmission time is delayed since an error correction is time-consuming. Moreover, there is a problem in that an overhead of a chip area increases since a complex ECC circuit should be inserted into the system.

The NAND type flash memory develops into a multivalued structure for storing information of two or more bits in one cell and is in a direction in which a threshold value is strictly controlled. For this reason, it may be considered that the effect of read disturb is a more serious problem in the future.

SUMMARY OF THE INVENTION

According to an aspect of the present invention, there is provided a memory system including: a flash memory that stores data; a memory that stores a read count table that indicates the number of times of data read from the flash memory; and a controller that performs: reading out the data from the flash memory; updating the read count table when the controller performs reading out the data from the flash memory; and refreshing the flash memory based on the read count table.

According to another aspect of the present invention, there is provided a method for controlling a memory system that has a flash memory, the method comprising: counting a read count that indicates the number of times of data read from the flash memory; comparing the read count with a reference value; and refreshing the flash memory on the basis of the result of comparison.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION OF THE PREFERRED EMBODIMENTS

Hereinafter, embodiments of the present invention will be described with reference to the accompanying drawings.

Figure 1:
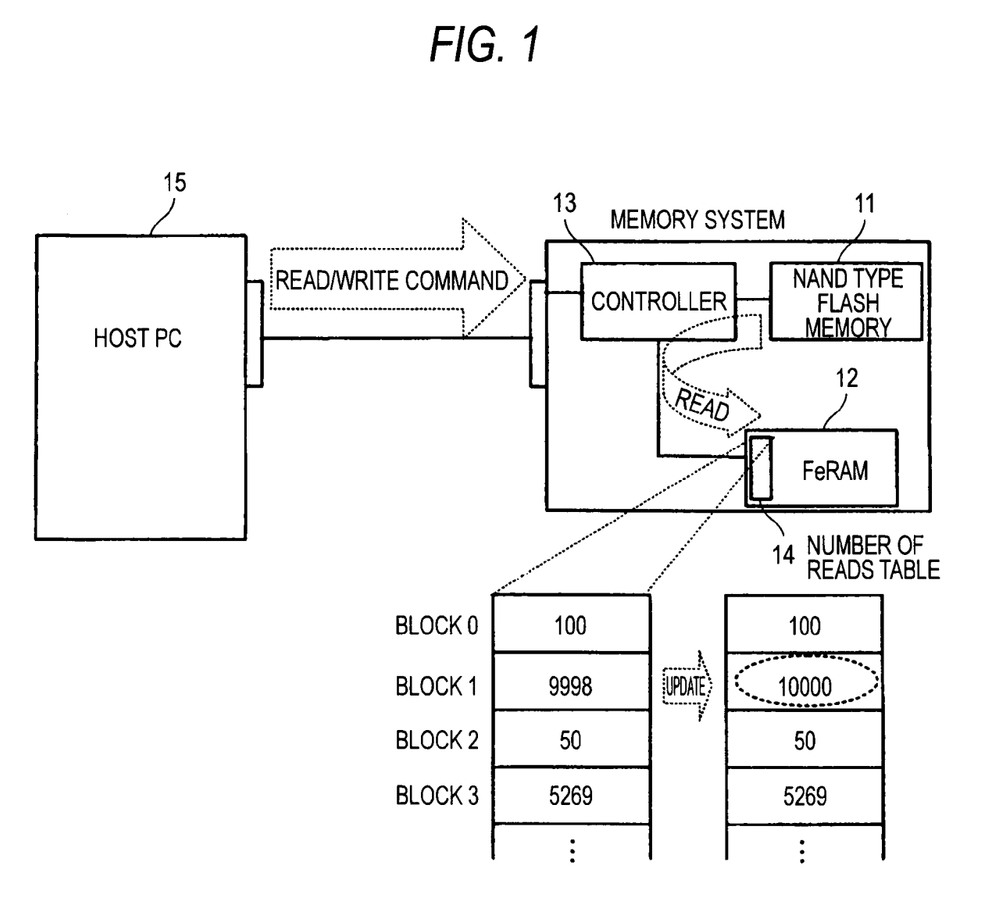
FIG. 1 is an exemplary circuit block diagram showing a memory system according to an embodiment 1.

FIG. 1 is a circuit block diagram showing a memory system according to an embodiment 1 of the present invention. In FIG. 1, there are mainly shown parts relating to read disturb.

The memory system according to the embodiment 1 of the present invention includes a NAND type flash memory 11, a ferroelectric nonvolatile memory 12 (hereinafter, referred to as "FeRAM 12") storing a number of reads table 14, and a controller 13 for controlling these components.

The NAND type flash memory 11 has a restriction on the number of reads of stored data and should be refreshed before the number of reads exceeds the restriction. In the following description, for example, an upper limit value of the number of reads is set to the number of times of 10000.

The FeRAM 12 has higher read and write rates than the NAND type flash memory 11 and is used as a cache of the NAND type flash memory 11.

Moreover, the FeRAM 12 maintains the number of reads to be updated whenever data is read from the NAND type flash memory 11 in the form of the table 14 (hereinafter, referred to as "number of reads table 14") on a block basis.

For example, the appearance of an update of the number of reads table 14 is shown in FIG. 1 when two pages of a block 1 are read. That is, when the two pages are read from the block 1, a value of "9998" corresponding to the number of reads of the block 1 is incremented by +2 and is updated to "10000".

The controller 13 reads data from and write data to the NAND flash memory 11 and the FeRAM 12 on the basis of a read or write command (hereinafter, referred to as "access command") from a host computer 15 (hereinafter, referred to as "host PC 15"), or controls an update of the number of reads table 14 or the like according to need.

Next, a control method of the memory system having the above-described configuration will be described.

Figure 2:
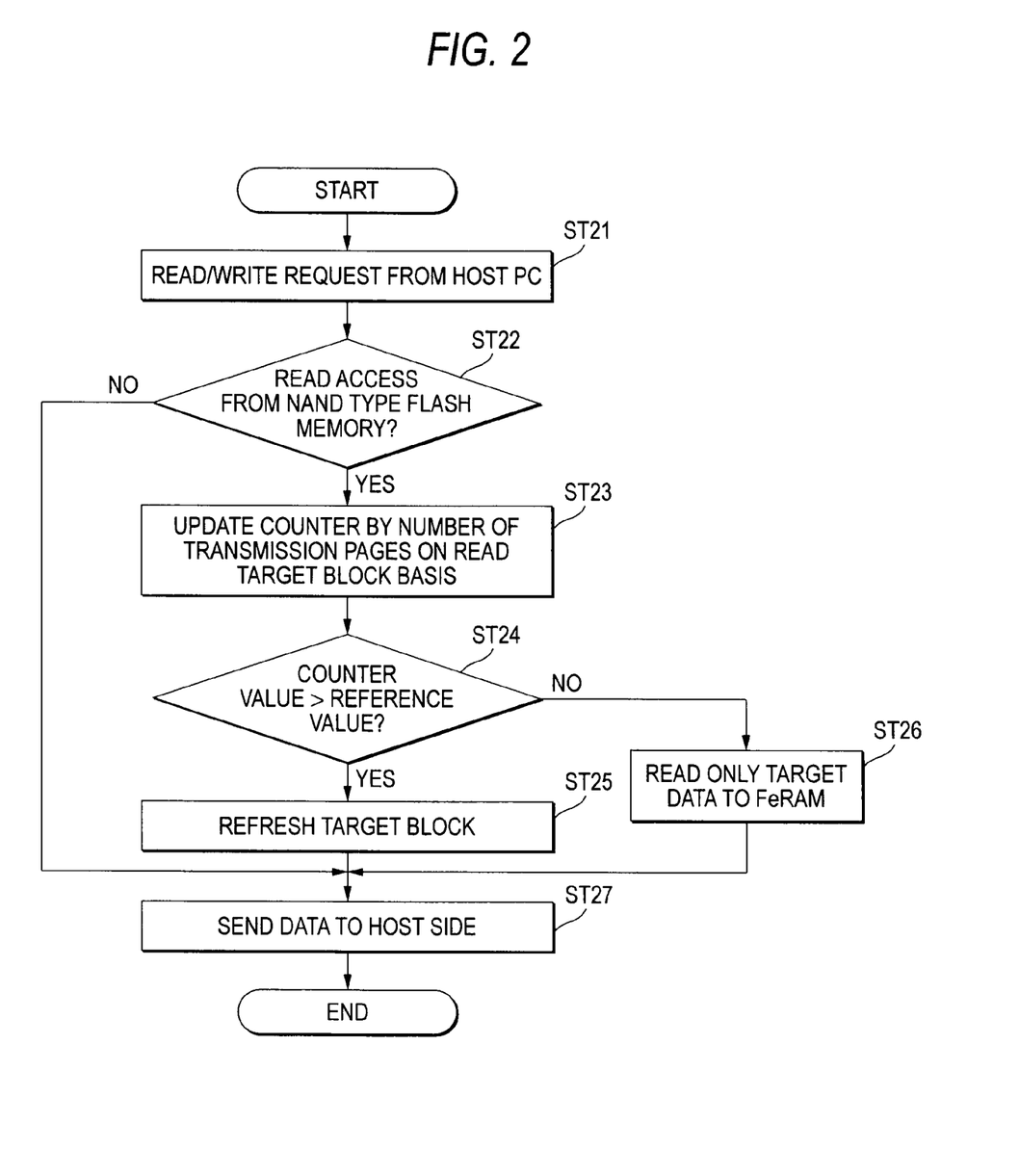
FIG. 2 is an exemplary flowchart showing a control method of the memory system according to the embodiment 1.

FIG. 2 is a flowchart showing the control method of the memory system according to the embodiment 1 of the present invention. In FIG. 2, there are mainly shown parts relating to a read disturb countermeasure when the access command is received from the host PC 15.

The control method of the memory system according to the embodiment 1 of the present invention includes a command reception step (ST21), a command determination step (ST22), an update step (ST23), a step of determining the number of times (ST24), a refresh step (ST25), a read step (ST26), and a data transmission step (ST27).

In ST21, the controller 13 receives the access command from the host PC 15.

When the access command is received in ST21, the controller 13 determines the necessity of the data read from the NAND type flash memory 11 from information of a transmission start address, a transmission capacity, and the like included in the access command in ST22.

Herein, it should be noted that data to the FeRAM 12 is read at the time of the write command as well as the read command (for example, in the case where insufficient data is read from the NAND type flash memory 11 to the FeRAM 12 when data is written back to the NAND type flash memory 11 so as to secure an empty area in the FeRAM 12).

When required data (including data required in a pre-read (pre-fetch) function or the like within the system) is already present in the FeRAM 12 and the data does not need to be read from the NAND type flash memory 11 ("NO"), the control proceeds to ST27.

However, when the required data is not present in the FeRAM 12 and the data needs to be read from the NAND type flash memory 11 ("YES"), the control proceeds to ST23.

In ST23, the controller 13 increments the number of reads of a corresponding block in the number of reads table 14 by the number of pages to be read from the NAND type flash memory 11.

Herein, the number of reads is maintained in a block unit rather than a page unit. However, since memory cells of all pages except a read target within the same block are damaged in the read, the substantially same effect as that of the case of the page unit is obtained even when the unit set for the number of reads is the block unit. Moreover, the capacity of the number of reads table 14 can be further reduced than that of the case of maintaining in the page unit.

In ST24, the controller 13 compares the number of reads updated in ST23 with a reference value (or the number of times of 10000) of the read restriction. When the updated number of reads exceeds the reference value ("YES"), the control proceeds to ST25. When the updated number of reads does not exceed the reference value ("NO"), the control proceeds to ST26.

In ST25, a block of which the number of reads exceeds the reference value is refreshed by the controller 13, and then the control proceeds to ST27. Details of the refresh will be described below with reference to FIG. 3.

In ST26, data serving as a target is read from the NAND type flash memory 11 by the controller 13 and is stored in the FeRAM 12, and then the control proceeds to ST27.

In ST27, the controller 13 sends the data required in ST21 from the FeRAM 12 to the host PC 15.

Figure 3:
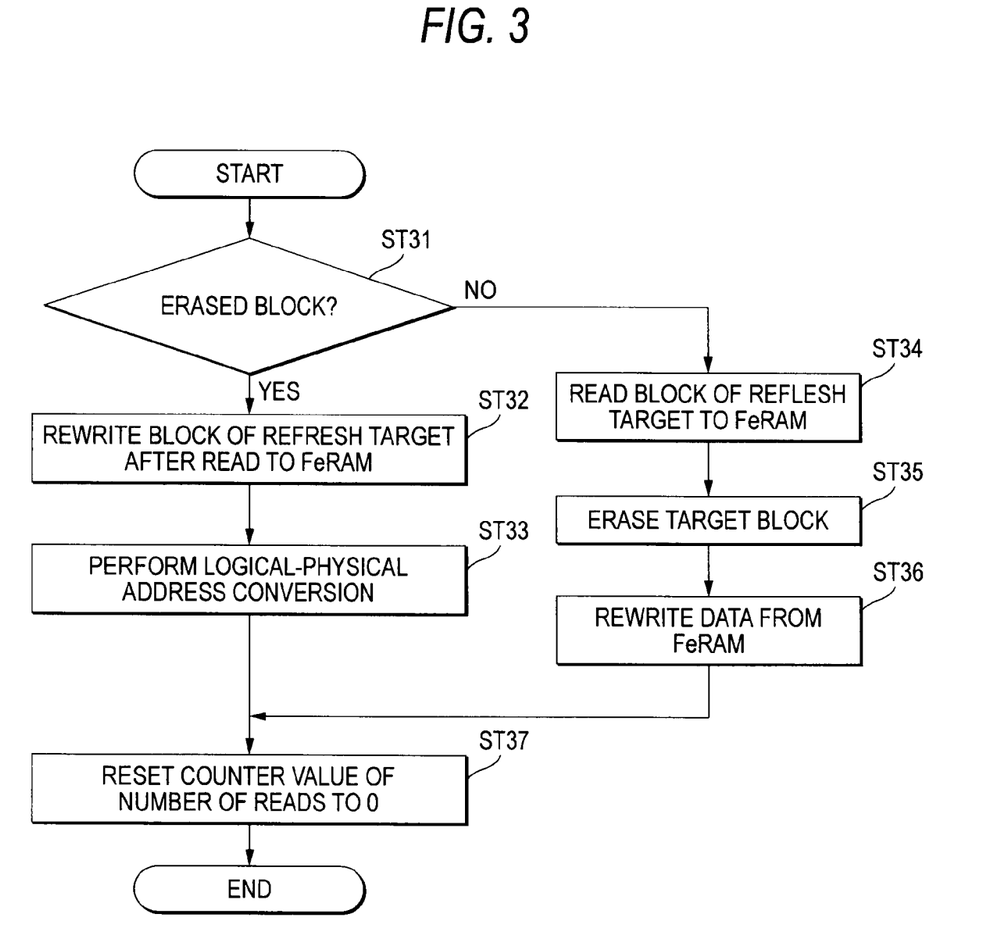
FIG. 3 is an exemplary flowchart showing a refresh operation relating to a read disturb countermeasure in the control method of the memory system according to the embodiment 1.

FIG. 3 is a flowchart showing a refresh operation relating to a read disturb countermeasure in the control method of the memory system according to the embodiment 1 of the present invention.

The refresh operation in the control method of the memory system according to the embodiment 1 of the present invention includes a block determination step (ST31), a copy step (ST32), an address conversion step (ST33), a read step (ST34), an erase step (ST35), a rewrite step (ST36), and a reset step (ST37).

In ST31, the controller 13 determines whether there is an erased block in the NAND type flash memory 11. When there is the erased block ("YES"), the control proceeds to ST32. When there is no erased block ("NO"), the control proceeds to ST34.

In ST32, the controller 13 reads data stored in a block serving as a refresh target from the NAND type flash memory 11 to the FeRAM 12 and rewrites the data to the erased block identified in ST31.

In ST33, the controller 13 performs the physical-logical address conversion such that a physical address of the erase block rewritten in ST32 is mapped to a logical address of the original block serving as the refresh target.

Herein, when the rewrite (refresh) from the FeRAM 12 to the NAND type flash memory 11 is done, data read to the FeRAM 12 can be written back along with data updated on the FeRAM 12 in place of direct writeback.

In ST34, the controller 13 reads data stored in the block serving as the refresh target from the NAND type flash memory 11 to the FeRAM 12 so as to save the data.

In ST35, the block in which the data is saved in ST34 is erased by the controller 13.

In ST36, the controller 13 writes back the data saved in the FeRAM 12 in ST34 to the block erased in ST35.

In ST37, the controller 13 resets the number of reads of the number of reads table 14 mapped to the block refreshed in ST32 and ST33 or ST34~ST36 to "0".

As described above, data destruction of a memory cell due to the read disturb is prevented in advance by managing and updating the number of reads from the NAND type flash memory 11 in the number of reads table 14 on a block basis and refreshing a block of which the number of reads exceeds its upper limit value (or the number of times of 10000).

According to the above-described embodiment 1, the number of reads is maintained in the number of reads table 14 of the FeRAM 12 on the block basis serving as the erase unit of the NAND type flash memory 11, the number of reads is updated whenever the data is read from the NAND type flash memory 11, and a corresponding block is refreshed when the number of reads exceeds the reference value, such that the read disturb of the NAND type flash memory 11 can be suppressed and the high-reliable memory system and the control method thereof can be realized.

According to the above-described embodiment 1, the read disturb of the NAND type flash memory 11 can be suppressed irrespective of the presence of the ECC or the correction capability of the ECC since a circuit of the NAND type flash memory 11 does not need to be reconfigured, such that the high-reliable memory system and the control method thereof can be realized.

According to the above-described embodiment 1, information of the number of reads is not lost even when power is instantaneously interrupted since the number of reads table 14 is stored in the FeRAM 12, such that the high-reliable memory system and the control method thereof can be realized.

In the above-described embodiment 1, there has been described that data of the block serving as the target in ST32 of the refresh is read to the FeRAM 12 once, but the present invention is not limited thereto. For example, when a copy function is provided in the NAND type flash memory 11, the target data can be directly copied to the erased block using the copy function.

Embodiment 2

Since a circuit diagram of this embodiment is the same as that of the embodiment 1, reference numerals of the components and the like equal to those of the embodiment 1 are used and a detailed description is omitted.

Figure 4:
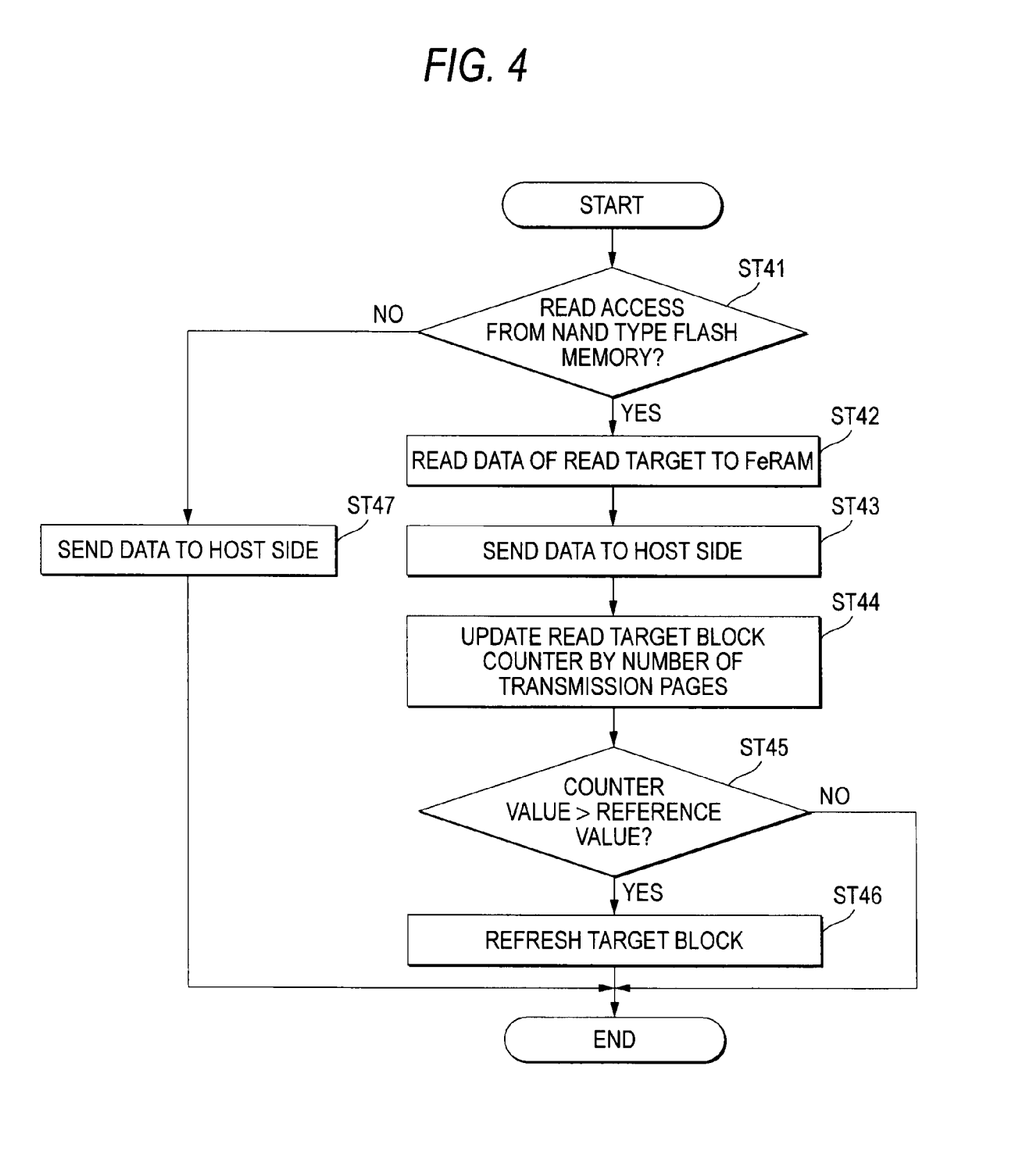
FIG. 4 is an exemplary flowchart showing a control method of a memory system according to an embodiment 2.

FIG. 4 is a flowchart showing the control method of the memory system according to an embodiment 2 of the present invention. In FIG. 4, there are mainly shown parts relating to a read disturb countermeasure when an access command is received from the host PC 15.

The control method of the memory system according to the embodiment 2 of the present invention includes a command determination step (ST41), a read step (ST42), a data transmission step (ST43 and ST47), an update step (ST44), a step of determining the number of times (ST45), and a refresh step (ST46).

When an access command is received from the host PC 15, the controller 13 determines the necessity of the data read from the NAND type flash memory 11 from information of a transmission start address, a transmission capacity, and the like included in the access command in ST41.

When required data is already present in the FeRAM 12 and the data does not need to be read from the NAND type flash memory 11 ("NO"), the control proceeds to ST47.

In ST47, the controller 13 sends the required data from the FeRAM 12 to the host PC 15.

On the other hand, when the required data is not present in the FeRAM 12 and the data needs to be read from the NAND type flash memory 11 ("YES"), the control proceeds to ST42.

In ST42, the required data is read from the NAND type flash memory 11 by the controller 13 and is stored in the FeRAM 12, and then the control proceeds to ST43.

In ST43, the data read to the FeRAM 12 in ST42 is sent from the FeRAM 12 to the host PC 15 by the controller 13.

In ST44, the controller 13 updates the number of reads table 14 by adding the number of pages read from the NAND type flash memory 11 in ST43 to the number of reads of a corresponding block. Herein, the number of reads is maintained in a block unit as in the embodiment 1.

In ST45, the controller 13 compares the number of reads updated in ST44 with a reference value (or the number of times of 10000) of the read restriction. When the updated number of reads exceeds the reference value ("YES"), the control proceeds to ST46. When the updated number of reads does not exceed the reference value ("NO"), the control ends.

In ST46, a block of which the number of reads exceeds the reference value is refreshed by the controller 13. Since the refresh operation in this embodiment is the same as that of the embodiment 1, a description is omitted.

As described above, this embodiment is different from the embodiment 1 in that the number of reads table 14 is updated after a data transmission to the host PC 15 is performed and the refresh of the NAND type flash memory 11 is performed if needed.

According to the above-described embodiment 2, not only the same effect as that of the embodiment 1 can be obtained, but also the host PC 15 does not need to wait in the meantime since the update of the number of reads table 14 and the refresh of the NAND type flash memory 11 are performed after the data transmission to the host PC 15, and the memory system and the control method thereof in which access is fast as viewed from the host PC 15 can be realized.

Embodiment 3

Figure 5:
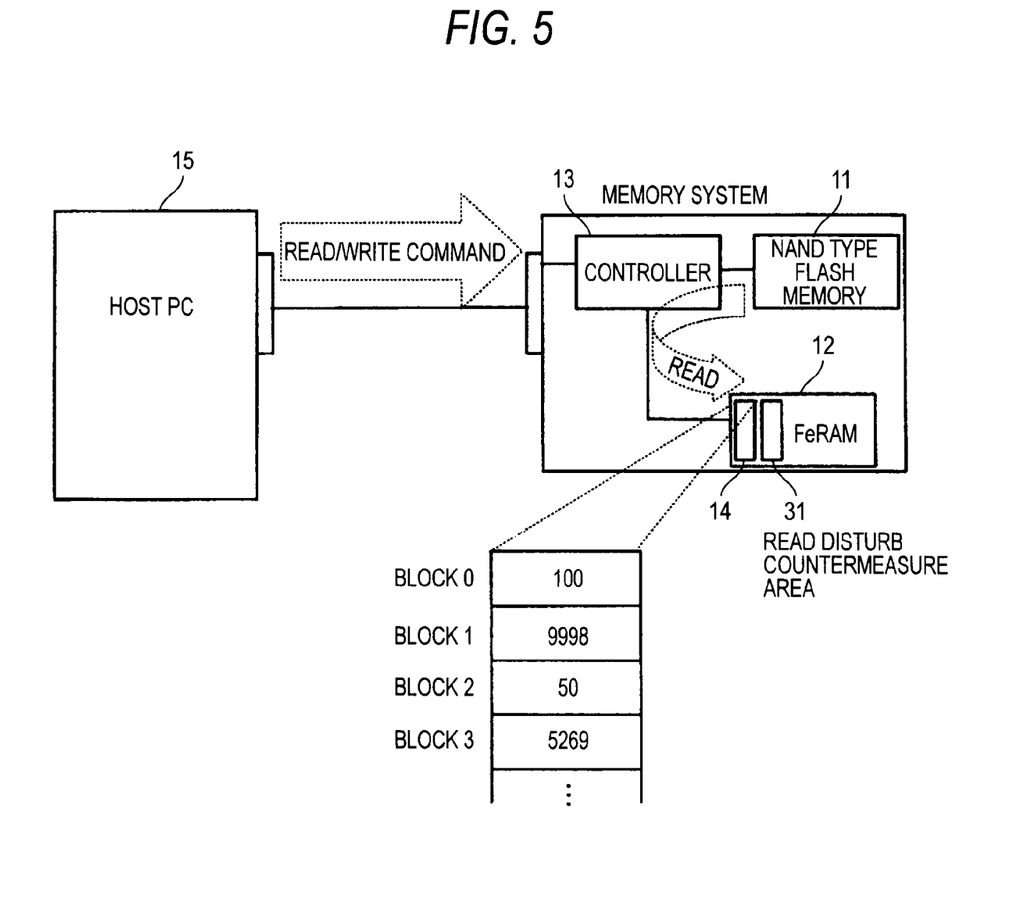
FIG. 5 is an exemplary circuit block diagram showing a memory system according to an embodiment 3.

FIG. 5 is a circuit block diagram showing a memory system according to an embodiment 3 of the present invention. In FIG. 5, there are mainly shown parts relating to a read disturb countermeasure. Since configuration blocks from which the configuration of the FeRAM 12 is excluded and the number of reads table 14 are the same as those of the embodiment 1, the same reference numerals are used and a detailed description is omitted.

The memory system according to the embodiment 3 of the present invention includes the NAND type flash memory 11, the FeRAM 12 having the number of reads table 14 and a read disturb countermeasure area 31, and the controller 13 for controlling these components.

The read disturb countermeasure area 31 is a dedicated area to which blocks of the relatively large number of reads are sent in advance from the NAND type flash memory 11. For access from the host PC 15 to these blocks, data is directly sent from the read disturb countermeasure area 31 to the host PC 15.

Next, a control method of the memory system having the above-described configuration will be described.

Figure 6:
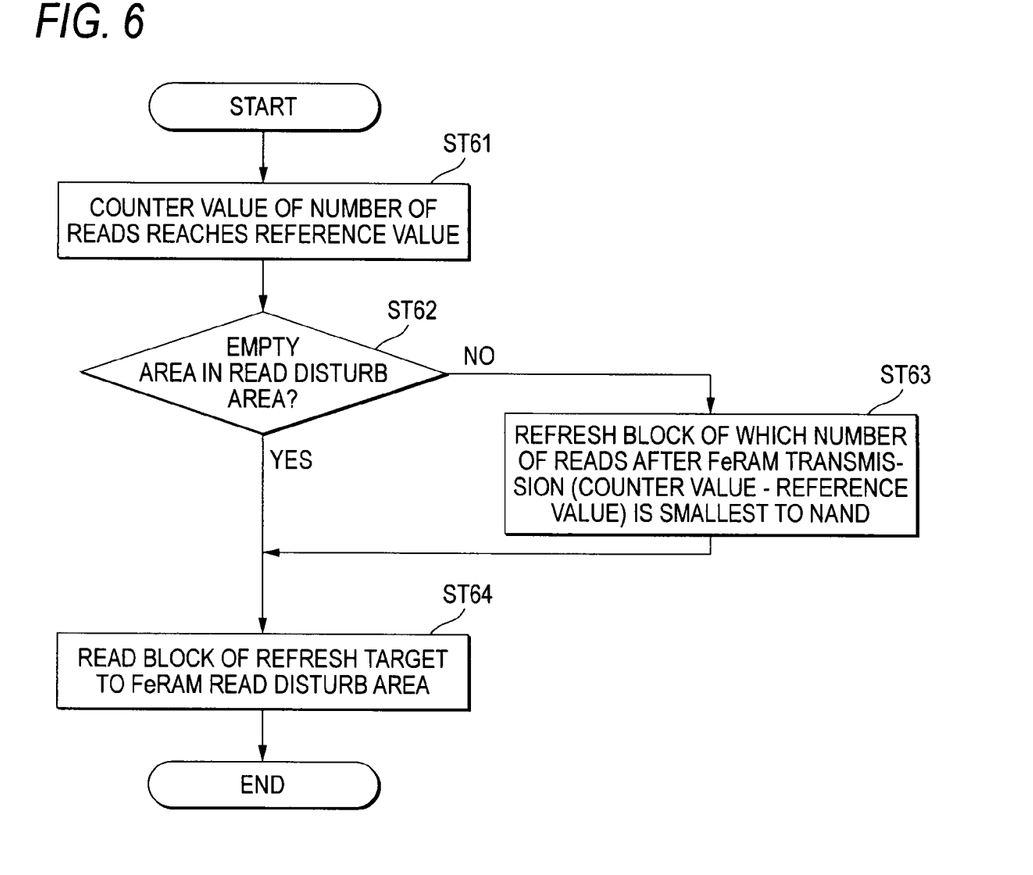
FIG. 6 is an exemplary flowchart showing a control method of the memory system according to the embodiment 3.

FIG. 6 is a flowchart showing the control method of the memory system according to the embodiment 3. In FIG. 6, there are mainly shown parts relating to a refresh operation when the number of reads exceeds a reference value.

The read disturb countermeasure in the control method of the memory system according to the embodiment 3 includes a step of updating the number of reads (ST61), an empty area determination step (ST62), a refresh step (ST63), and a read step (ST64).

In ST61, the controller 13 updates the number of reads of a block serving as a target and determines whether its value exceeds the reference value. At the time of exceeding the reference value, the control proceeds to ST62.

In ST62, the controller 13 determines whether there is an empty area in the read disturb countermeasure area 31. When there is the empty area ("YES"), the control proceeds to ST64. When there is no empty area ("NO"), the control proceeds to ST63.

In ST63, the controller 13 computes "Number of Reads— Reference value" for blocks sent to the read disturb countermeasure area 31, refreshes a block having a smallest value to the NAND type flash memory 11, and creates an empty area. Since a detailed operation of the refresh is the same as that of the embodiment 1, a description is omitted.

Figure 7:
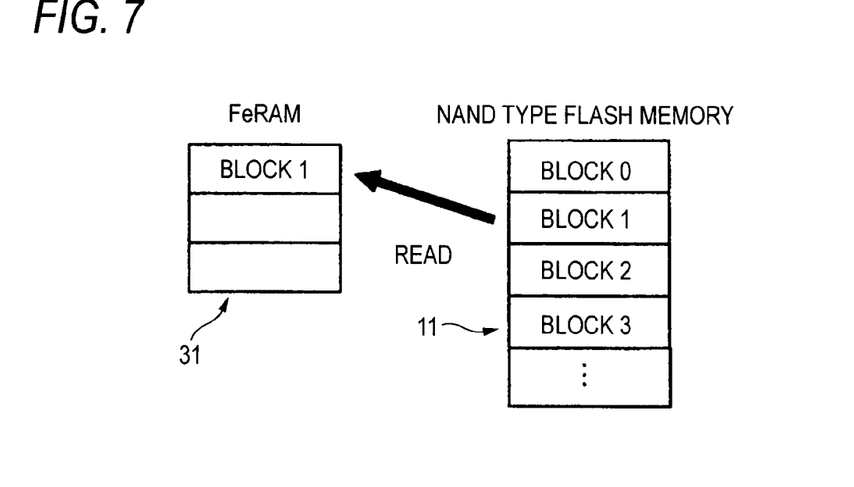
FIG. 7 is an exemplary image diagram showing a read step (ST64) to a read disturb countermeasure area 31 in the control method of the memory system according to the embodiment 3.

In ST64, the controller 13 reads a block of which the number of reads is determined to exceed the reference value in ST61 to the read disturb countermeasure area 31 as shown in FIG. 7.

In this embodiment as described above, a target block is read to the read disturb countermeasure area 31 of the FeRAM 12 in the step in which the number of reads exceeds the reference value and the read from the NAND type flash memory 11 is avoided. Herein, the number of reads is updated when a block present in the read disturb countermeasure area 31 is read.

When there is no empty area in the read disturb countermeasure area 31, the most unread block, that is, the block of the smallest number of reads in the FeRAM 12, is refreshed. The effect of an efficient cache can be expected by causing a block of the large number of reads to reside in the read disturb countermeasure area 31 of the FeRAM 12.

Figure 8:
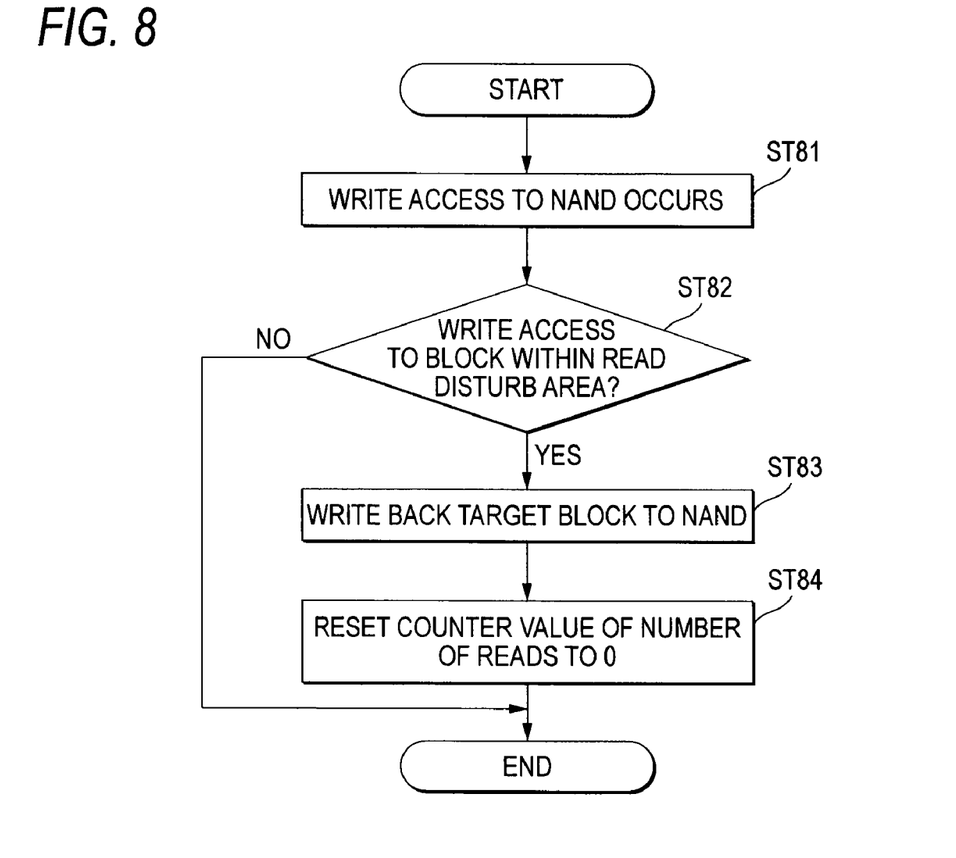
FIG. 8 is an exemplary flowchart showing a write operation relating to a read disturb countermeasure in the control method of the memory system according to the embodiment 3.

FIG. 8 is a flowchart showing a write operation relating to a read disturb countermeasure in the control method of the memory system according to the embodiment 3 of the present invention. In FIG. 8, there are mainly shown parts relating to the write operation when a write request from the host PC 15 for a block of the read disturb countermeasure 31 is made.

The write operation relating to the read disturb countermeasure in the control method of the memory system according to the embodiment 3 of the present invention includes a command reception step (ST81), a determination step (ST82), a writeback step (ST83), and a reset step (ST84).

In ST81, the controller 13 receives an access command from the host PC 15. If the access command is the write request, the control proceeds to ST82.

In ST82, the controller 13 determines whether there is a block serving as a write target in the read disturb countermeasure area 31. When there is the target block in the read disturb countermeasure area 31 ("YES"), the control proceeds to ST83. When there is no target block in the read disturb countermeasure area 31 ("NO"), the writeback from the read disturb countermeasure area 31 does not occur and the control ends.

Figure 9:
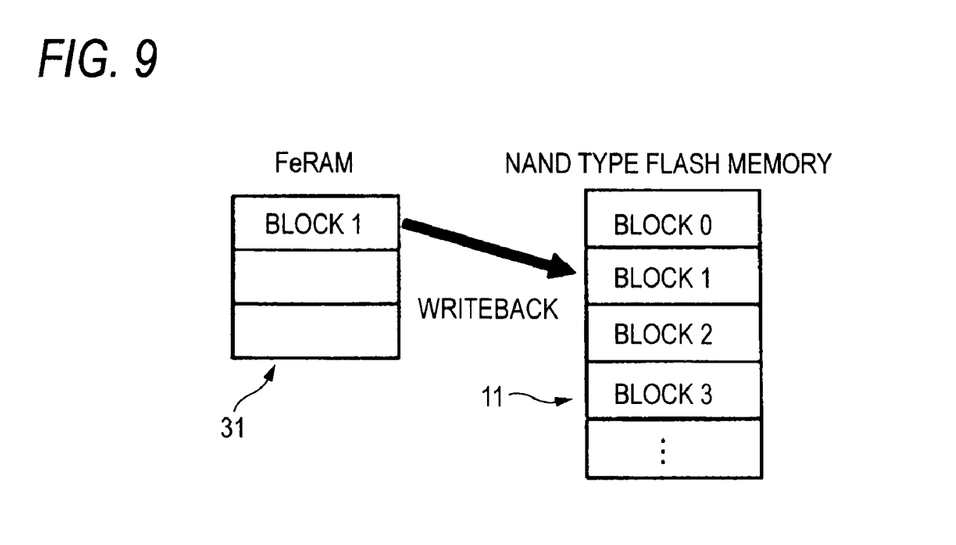
FIG. 9 is an exemplary image diagram showing a writeback step (ST83) from the read disturb countermeasure area 31 in the control method of the memory system according to the embodiment 3.

In ST83, as shown in FIG. 9, the controller 13 performs the writeback to the NAND type flash memory 11 after rewriting the target block of the read disturb countermeasure area 31 based on a predetermined condition. The predetermined condition may be at least one of the following configurations:
  (1) the number of read in the target block of the read disturb countermeasure area 31 reaching a threshold;
  (2) the elapsed time since the target data is cashed having the longest elapsed time in the cash area; and
  (3) the elapsed time since the last access thereto having the longest elapsed time in the cash area.

In ST84, the controller 13 resets the number of reads of the number of reads table 14 mapped to a block written back in ST83 to "0". This is because there is the same effect as that of the refresh of the target block by the write to the NAND type flash memory 11.

When the write request from the host PC 15 occurs as described above, the refresh occurring according to the determination of only the number of reads, that is, the number of writes/erases, can be reduced since the refresh can be provided by writing back data from the read disturb countermeasure area 31 to the NAND type flash memory 11.

According to the above-described embodiment 3, the read disturb of the NAND type flash memory 11 can be suppressed and the high-reliable memory system and the control method thereof can be realized, since not only the same effect as that of the embodiment 1 can be obtained, but also the read from the NAND type flash memory 11 is avoided by reading a block of the number of reads exceeding the reference value to the read disturb countermeasure area 31 of the FeRAM 12.

According to the above-described embodiment 3, the FeRAM 12 can be used as an efficient cache since a block of the relatively large number of reads resides in the read disturb countermeasure area 31 of the FeRAM 12, such that the memory system and the control method thereof in which access to the host PC 15 is fast can be realized.

According to the above-described embodiment 3, the read disturb of the NAND type flash memory 11 can be suppressed since the number of writes/erases is reduced by providing the refresh to the NAND type flash memory 11 when the write request from the host PC 15 occurs, such that the high-reliable memory system and the control method thereof can be realized.

In the above-described embodiment 3, there has been described that a block of the smallest number of reads is refreshed in the read disturb countermeasure area 31 in ST63, but the present invention is not limited thereto. For example, a method for refreshing from an oldest block assigned to the read disturb countermeasure area 31 or refreshing from a block for which a longest time has elapsed after the last access can be considered.

Embodiment 4

Figure 10:
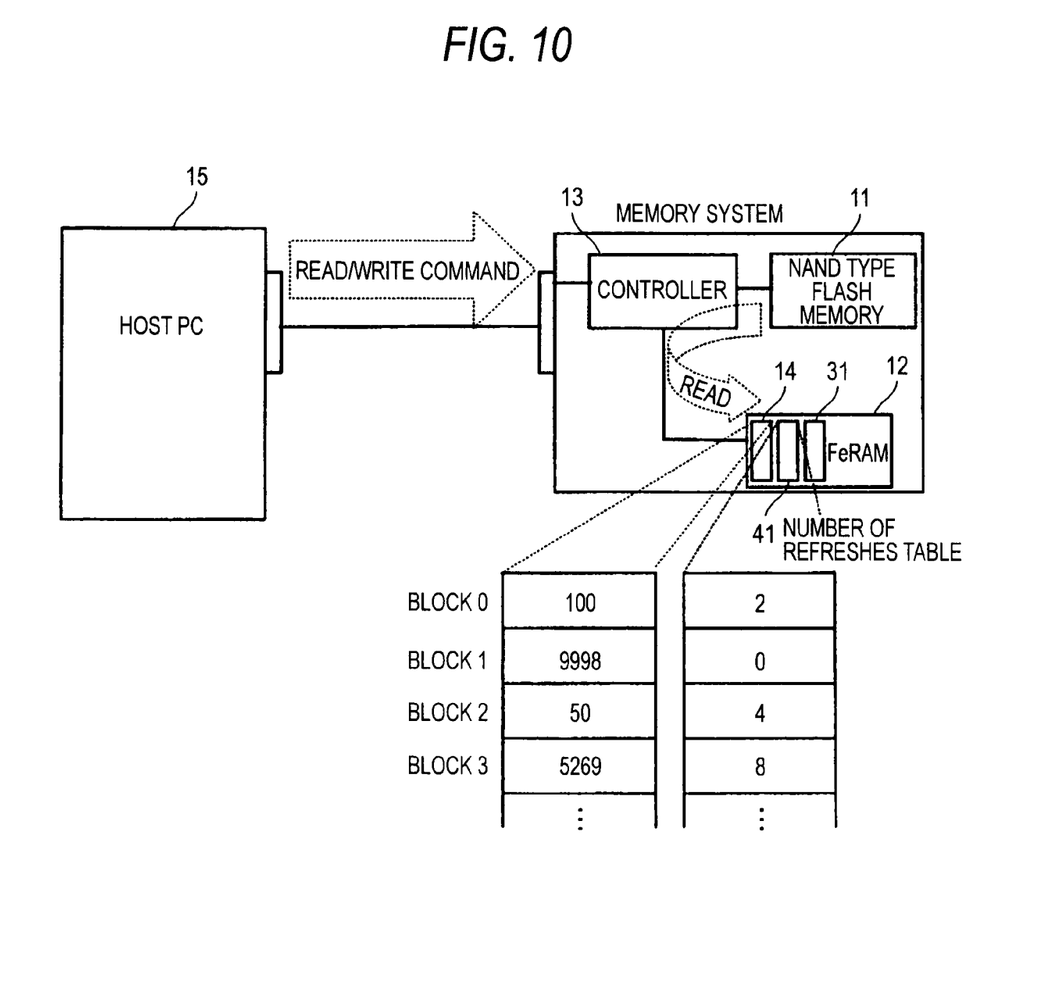
FIG. 10 is an exemplary circuit block diagram showing a memory system according to an embodiment 4.

FIG. 10 is a circuit block diagram showing a memory system according to an embodiment 4 of the present invention. In FIG. 10, there are mainly shown parts relating to a read disturb countermeasure. Since configuration blocks from which the configuration of the FeRAM 12 is excluded, the number of reads table 14 and the read disturb countermeasure area 31 are the same as those of the embodiment 1 and the embodiment 3, the same reference numerals are used and a detailed description is omitted.

The memory system according to the embodiment 4 of the present invention includes the NAND type flash memory 11, the FeRAM 12 having the number of reads table 14, a read disturb countermeasure area 31 and a number of refreshes table 41, and the controller 13 for controlling these components.

The number of refreshes table 41 maintains the number of times of forcibly refreshing on a block basis when the number of reads of a block serving as a read target of the NAND type flash memory 11 exceeds a reference value.

The controller 13 determines whether to read block data to the read disturb countermeasure area 31 or forcibly refresh block data without the read when the number of reads exceeds the reference value by retrieving the corresponding number of refreshes of the number of refreshes table 41.

If the number of refreshes maintained in the number of refreshes table 41 is large, the controller 13 determines that its block is that in which the write occurrence is difficult even when the block is read to the read disturb countermeasure area 31, and forcibly makes the refresh.

Since the control method of the memory system having the above-described configuration is the same as those of the embodiment 1 and the embodiment 3 except for the determination as to whether to perform the forcible refresh using the number of refreshes table 41, a detailed description is omitted.

According to the above-described embodiment 4, the FeRAM 12 can be used as a more efficient cache and the high-reliable memory system and the control method thereof in which access to the host PC 15 is fast can be realized, since not only the same effect as those of the embodiment 1 and the embodiment 3 can be obtained, but also a block of a high write frequency can be maintained in the read disturb countermeasure area 31.

Embodiment 5

Figure 11:
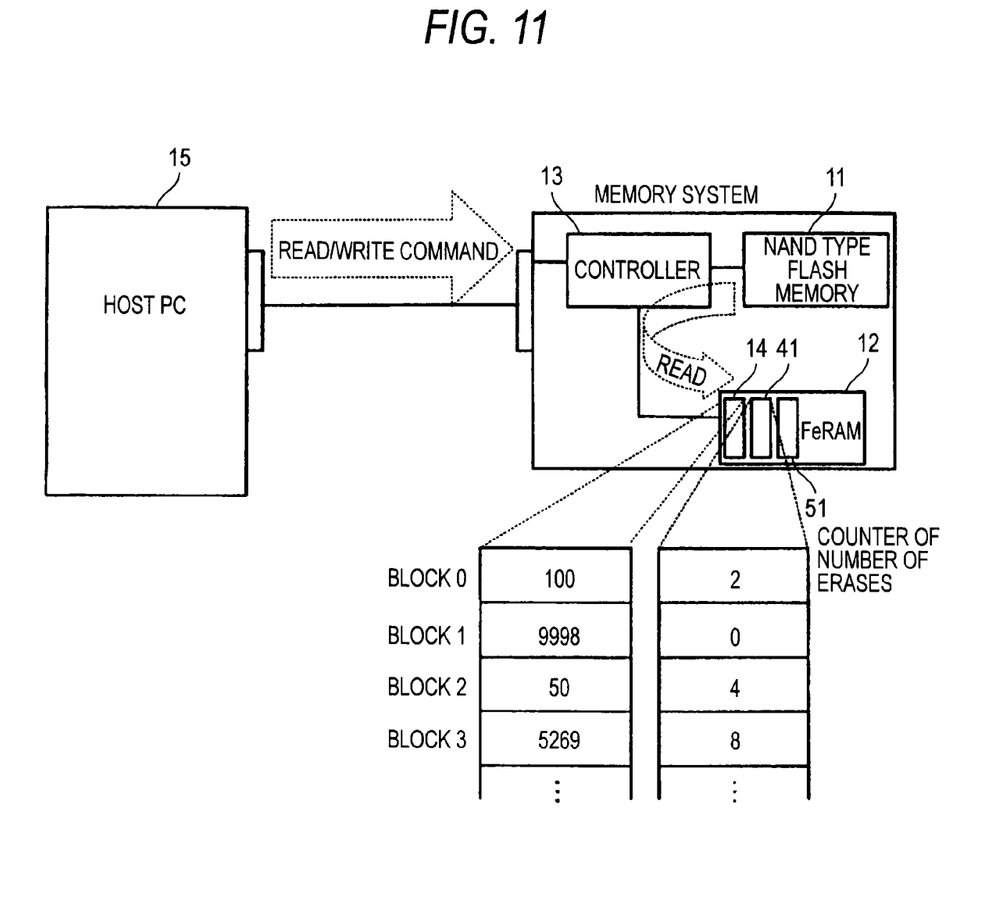
FIG. 11 is an exemplary circuit block diagram showing a memory system according to an embodiment 5.

FIG. 11 is a circuit block diagram showing a memory system according to an embodiment 5 of the present invention. In FIG. 11, there are mainly shown parts relating to a read disturb countermeasure. Since configuration blocks from which the configuration of the FeRAM 12 is excluded, the number of reads table 14 and the number of refreshes table 41 are the same as those of the embodiment 1 and the embodiment 4, the same reference numerals are used and a detailed description is omitted.

The memory system according to the embodiment 5 of the present invention includes the NAND type flash memory 11, the FeRAM 12 having the number of reads table 14, the number of refreshes table 41 and a number of erases table 51, and the controller 13 for controlling these components.

The number of erases table 51 maintains the number of times of erasing a block in the NAND type flash memory 11 on a block basis. In addition to the case where refresh occurs, the number of erases table 51 is updated even when a block is erased by a write command or an erase command from the host PC 15.

The number of reads table 14 is updated in the same way as that of the embodiment 1 or the embodiment 2. When the number of reads exceeds a reference value, the number of refreshes table is updated. Accordingly, so-called wear leveling is executed simultaneously when the refresh is performed.

That is, the number of forcible refreshes of the read disturb countermeasure and the number of erases are simultaneously averaged by converting physical addresses of a block of the large number of erases and a block to be refreshed.

If the refresh is required, it can mean that the write occurrence in the block is difficult and the number of writes/erases is small. Accordingly, the number of writes/erases can be reduced on the block basis by executing wear leveling as described above.

Since the control method of the memory system having the above-described configuration is the same as that of the embodiment 1 or the embodiment 2 except that wear leveling is executed using the number of refreshes table 41 and the number of erases table 51, a detailed description is omitted.

According to the above-described embodiment 5, the read disturb of the NAND type flash memory 11 can be suppressed and the high-reliable memory system and the control method thereof can be realized, since not only the same effect as that of the embodiment 1 can be obtained, but also wear leveling is executed using the number of refreshes table 41 and the number of erases table 51 and the number of writes/erases is reduced on the block basis.

In the above-described embodiment 5, there has been described that physical addresses of a block of the large number of erases and a block to be refreshed are converted, but the present invention is not limited thereto. For example, a block of the large number of erases and a block of the large number of refreshes can be converted.

In the above-described embodiments 1 to 5, there has been described that data from the host PC 15 is stored in the NAND type flash memory 11, but the present invention is not limited thereto and is applicable to a flash type EEPROM requiring refresh due to read disturb in principle.

In the above-described embodiments 1 to 5, there has been described that the number of reads table 14 is maintained in the ferroelectric memory (FeRAM 12), but the present invention is not limited thereto and is applicable to a nonvolatile memory and a volatile memory in which data is accessible at a higher rate than that of the NAND type flash memory 11 in principle.

As described with reference to the embodiment, there is provided a memory system and a control method thereof that can control read disturb of a flash memory.

What is claimed is:

1. A memory system comprising:
  a flash memory that stores data in a plurality of memory blocks;
  a memory that stores a read count table that indicates, for each memory block, a number of times that data is read from a corresponding memory block in the flash memory; and a controller configured
- to read out the data from the flash memory;
- to update, for each memory block, the read count table when the controller reads out the data from the corresponding memory block in the flash memory; and
- to refresh the flash memory based on the read count table on a memory block basis.

2. The memory system according to claim 1, wherein, when the controller refreshes the flash memory, the controller stores in the memory, the data stored in a target memory block that is subjected to the refresh.

3. The memory system according to claim 2, wherein, when the controller refreshes the flash memory, the controller writes back the data stored in the memory to the target memory block after erasing the target memory block.

4. The memory system according to claim 2, wherein, when an erased memory block that is already erased by the controller exists in the flash memory, the controller writes the data stored in the memory to the erased memory block and changes an address of the erased memory block with an address of the target memory blocks.

5. The memory system according to claim 1,
- wherein the memory has a cash area for reducing read disturb, the cash area being configured to store data stored in the flash memory, and
- wherein, when one of the read counts reaches a read count threshold, the controller stores in the cash area the data stored in a target memory block corresponding to the read count that reached the read count threshold.

6. The memory system according to claim 5,
- wherein, when the cash area is full, the controller moves first target data stored in the cash area to corresponding memory block by block unit to prepare free area in the cash area, the first target data satisfying a first predetermined condition.

7. The memory system according to claim 6, wherein the controller moves the first target data to the corresponding memory block, the first target data having a smallest read count in all of the data stored in the memory.

8. The memory system according to claim 6, wherein the controller moves the first target data to the corresponding memory block, the first target data being the earliest stored data in all of the data stored in the memory.

9. The memory system according to claim 6, wherein the controller moves the first target data to the corresponding memory block, the first target data having a longest elapsed time since the last access thereto in all of the data stored in the memory.

10. The memory system according to claim 5, wherein the controller writes back second target data stored in the cash area to corresponding memory block by block unit, the second target data satisfying a second predetermined condition.

11. The memory system according to claim 10, wherein the controller writes back the second target data to the corresponding memory block, the second target data having the read count that reaches a write back threshold.

12. The memory system according to claim 10, wherein the controller writes back the second target data to the corresponding memory block, the second target data having a longest elapsed time since the second target data is stored in the cash area.

13. The memory system according to claim 10, wherein the controller writes back the second target data to the corresponding memory block, the second target data having an longest elapsed time since the last access thereto in the cash area.

14. The memory system according to claim 2,
- wherein the memory further stores a number of times of refresh for each of the memory block as refresh counts, and
- when the target memory block has a refresh count that reaches a refresh count threshold, the controller refreshes the target memory block instead of storing the data stored in the target memory block to the cash area.

15. The memory system according to claim 5,
- wherein the memory further stores a number of times of erasing for each of the memory block as erase counts,
- wherein the controller replaces an address of the target block with an address of a block that has the erase count reaching an erase count threshold.

16. The memory system according to claim 1, wherein the memory is nonvolatile memory.

17. The memory system according to claim 1, wherein the memory is FeRAM.

18. The memory system according to claim 1, wherein the memory is DRAM.

19. A method for controlling a memory system that has a flash memory, the method comprising:
- storing data in a plurality of memory blocks in a flash memory;
- storing, in a memory, a read count table that indicates, for each memory block, a number of times that data is read from a corresponding memory block in the flash memory;
- reading out, through a controller, the data from the flash memory;
- updating, for each memory block, the read count table when the controller reads out the data from the corresponding memory block in the flash memory; and
- refreshing the flash memory based on the read count table on a memory block basis.

20. The memory system according to claim 1, wherein the memory is volatile memory.

* * * * *